(12) United States Patent  
Biagiotti et al.

(10) Patent No.: US 9,933,984 B1
(45) Date of Patent: Apr. 3, 2018

(54) METHOD AND ARRANGEMENT FOR EYE DIAGRAM DISPLAY OF ERRORS OF DIGITAL WAVEFORMS

(71) Applicants: Advanced Testing Technologies, Inc., Hauppauge, NY (US); Eli Levi, Dix Hills, NY (US)

(72) Inventors: William Biagiotti, St. James, NY (US); Eli Levi, Dix Hills, NY (US); Robert Spinner, East Northport, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 323 days.

(21) Appl. No.: 14/859,569

(22) Filed: Sep. 21, 2015

Related U.S. Application Data

(60) Provisional application No. 62/057,033, filed on Sep. 29, 2014, provisional application No. 62/076,584, filed on Nov. 7, 2014.

(51) Int. Cl.
| | |
|---|---|
| *H04B 3/46* | (2015.01) |
| *H04B 17/00* | (2015.01) |
| *H04Q 1/20* | (2006.01) |
| *G06F 3/14* | (2006.01) |
| *G01D 7/00* | (2006.01) |

(52) U.S. Cl.
CPC .................. *G06F 3/14* (2013.01); *G01D 7/00* (2013.01)

(58) Field of Classification Search
CPC ........ G06F 3/14; G01D 7/00; G01R 13/0218; G01R 31/31711; G01R 13/0254; G01R 29/027; H04B 17/23; H04B 10/0799; H04L 7/0331; H04L 1/24; H04L 25/03006

USPC .................................................. 375/224, 228
See application file for complete search history.

(56) References Cited

U.S. PATENT DOCUMENTS

| | | |
|---|---|---|
| 4,523,231 A | 6/1985 | Therrien |
| 6,502,045 B1 | 12/2002 | Biagiotti |
| 6,609,217 B1 | 8/2003 | Bonissone et al. |
| 6,628,828 B1 | 9/2003 | Stokes et al. |
| 6,629,272 B1 | 9/2003 | Jungerman |
| 6,806,877 B2 | 10/2004 | Fernando |
| 6,847,905 B2 | 1/2005 | Etheridge et al. |
| 6,934,647 B2 | 8/2005 | MacDonald |
| 7,084,394 B2 | 8/2006 | Guevremont et al. |
| 7,126,631 B1 | 10/2006 | Minemier |

(Continued)

*Primary Examiner* — Phuong Phu
(74) *Attorney, Agent, or Firm* — Brian Roffe

(57) ABSTRACT

Method and arrangement for displaying a digital waveform in an eye diagram simultaneously with an indication of acceptability of the digital waveform. A decoded digital waveform is separated into overlapping waveform permutations based on a number of digital states and transition points in the eye diagram. Submasks equal in number to the waveform permutations and that are derived from a common, known good waveform, are retrieved from a memory component. Each retrieved submask is applied to a corresponding waveform permutation to determine any locations at which the waveform permutation exceeds a boundary of the submask. Only one submask is applied to each waveform permutation. The waveform is displayed in the eye diagram simultaneous with a visual indication of the locations at which any of the waveform permutations exceeds the boundary of the corresponding submask, to enable visual assessment of the acceptability/validity of the digital waveform.

20 Claims, 8 Drawing Sheets

(56) References Cited

U.S. PATENT DOCUMENTS

| | | |
|---|---|---|
| 7,310,389 B2 | 12/2007 | Waschura et al. |
| 7,522,661 B2 | 4/2009 | Nelson et al. |
| 7,729,872 B2 | 6/2010 | Obata |
| 7,970,283 B2 * | 6/2011 | Giaretta ............... G02B 6/4246 398/135 |
| 7,983,332 B2 * | 7/2011 | Smith ................. G01R 13/0218 375/226 |
| 8,229,754 B1 | 7/2012 | Ramirez et al. |
| 8,239,139 B2 | 8/2012 | Upstill et al. |
| 8,537,144 B2 | 9/2013 | Matthijs et al. |
| 8,655,617 B1 | 2/2014 | Biagiotti et al. |
| 8,782,558 B1 | 7/2014 | Biagiotti et al. |
| 8,788,228 B1 | 7/2014 | Biagiotti et al. |
| 8,995,510 B2 | 3/2015 | Obata |
| 9,026,945 B2 | 5/2015 | Dees et al. |
| 9,058,442 B2 | 6/2015 | Holls |
| 9,076,457 B1 | 7/2015 | Orler |
| 2003/0112241 A1 * | 6/2003 | Fernando ............... G06T 11/206 345/440 |
| 2003/0165259 A1 * | 9/2003 | Balent ..................... G06T 7/00 382/113 |
| 2003/0174789 A1 * | 9/2003 | Waschura ................. H04L 1/24 375/340 |
| 2004/0153883 A1 * | 8/2004 | Miller .................. H04L 7/0331 714/52 |
| 2006/0126916 A1 | 6/2006 | Kokumai |
| 2007/0050166 A1 | 3/2007 | Spinner et al. |
| 2007/0115360 A1 | 5/2007 | Biagiotti et al. |
| 2008/0187033 A1 * | 8/2008 | Smith .................... H04B 17/23 375/228 |
| 2009/0245339 A1 * | 10/2009 | Obata ............... G01R 31/31711 375/226 |
| 2009/0257745 A1 * | 10/2009 | Petrilla .............. H04B 10/0799 398/30 |
| 2010/0063760 A1 * | 3/2010 | Rule .................. G01R 13/0254 702/68 |
| 2010/0128763 A1 * | 5/2010 | Morita ............... H04L 25/03006 375/219 |
| 2010/0308856 A1 * | 12/2010 | Watanabe ............ G01R 29/027 324/762.01 |
| 2011/0020628 A1 | 8/2011 | Faulkner et al. |

* cited by examiner

METHOD AND ARRANGEMENT FOR EYE DIAGRAM DISPLAY OF ERRORS OF DIGITAL WAVEFORMS

CROSS-REFERENCE TO RELATED APPLICATIONS

This application claims priority under 35 U.S.C. § 119(e) of U.S. provisional patent application Ser. Nos. 62/057,033 filed Sep. 29, 2014, now expired, and 62/076,584 filed Nov. 7, 2014, now expired, both of which are incorporated by reference herein.

FIELD OF THE INVENTION

The present invention relates generally to the field of automatic test equipment for the testing of electronic signals generated by equipment under test including, but not limited to, simultaneous complex signals. More specifically, the present invention relates to software methods (algorithms embodied on computer-readable media) for determining the validity of one or more complex electrical signals and software methods for analyzing the image content of complex signals.

The present invention also relates to the display of information revealing the degree to which complex electrical signals are valid, or invalid, to enable personnel to view the displays and react to the valid or invalid complex electrical signals.

The present invention also relates to techniques for transforming a digital waveform into a display of the digital waveform in an eye diagram with an indication of acceptability of the digital waveform.

BACKGROUND OF THE INVENTION

Automatic test equipment for the measurement and analysis of complex signals as exemplified by video signals is known. Among others, the current assignee, Advanced Testing Technologies, Inc., develops such equipment including instrumentation and related software.

The capability of video test instrumentation is mainly limited to commercial standard video format frame capture coupled with basic timing and analog component analysis. Because of the complexity, manual verification of image content is limited to that of very basic human pattern recognition, such as vertical or horizontal bars, grayscale, checkerboards or other images with easily discernable attributes for the user/operator to analyze through visual comparison. Image content is often a critical requirement in the pass/fail criterion of a system. Testing a system's image content becomes a trade-off requiring selection between utilizing canned, standard tests that a system manufacturer often provides, a hot mock-up or investment in a thorough objective analysis. The latter would require test development time that a user would be required to undertake to create a test for a nonstandard, specific (perhaps, proprietary) image.

Validation of video signals (as well as other electrical signals) is typically based upon synchronous and asynchronous timing measurements, analog voltage measurements and/or visual content accuracy. An analog video standard, such as RS-170, describes specific time durations and voltage amplitudes for all of its components. The number of discrete analog measurements necessary for 100% compliance to the commercial standard is in the tens of thousands. Typical compromise to verify an RS-170 signal would include duration measurements of sync pulses, blanking intervals, and line time, and comparison of one or more of these measurements to specified limits. Next, voltage amplitude tests of those components would be measured and examined in a similar fashion.

Visual image content testing is designed around the expected image. If the image consists of a series of white bars on a black background, the start and end pixel denoting the location of each bar (located by, for example, measuring pixel amplitudes) may be compared to the expected location of the bar. If the signal characteristics are less than ideal due to, for example, equipment and/or cabling anomalies, the edge of the illuminated bar may possess a slow rise or fall time, a condition that would present visually as blurry (no distinct edges). Other possible failure modes include electrical noise, intermittent glitches, and ringing (reflections). Identification of these anomalies in an automated environment requires extensive testing, is easily missed by the user/operator performing analysis and/or is simply ignored.

As for related prior art, U.S. Pat. No. 6,502,045, assigned to the current assignee, includes a description of an 'error bounds tool', and which patent is incorporated by reference herein. Differing from the error bounds tool disclosed in the '045 patent, the present invention adds a new and novel method to automatically extract complex signal characteristics to create a set of rules from a known, good (golden) video image, describing the timing relationships, analog levels and image content, apply or compare the set of rules to a video image under-test and give a statistical report of the analysis including a pass/fail determination. As will be described more fully below, the present invention is capable of reducing the test development time resulting in measurable economic and time savings. In addition, it is now possible to test images, such as actual, complex military radar imagery, that would not have been possible with current off-the-shelf commercial equipment. Historically, this level of testing required an operator-in-the-loop to manually examine such a signal. Additional savings are produced by removing manual operations from the testing sequence.

A large portion of digital video utilizes transmission systems with differential TMDS techniques involving multiple pairs of transmitter/receiver pairs, such as for DVI and HDMI formats. Transition-minimized differential signaling (TMDS) is a technology for transmitting high-speed serial data and is used by the DVI and HDMI video interfaces, as well as other digital communication interfaces. The cables for these video formats employ independent copper wiring for each physical TMDS pair. Since each one of these TMDS pairs is susceptible to failure, each pair should be tested and verified. High speed oscilloscopes are commonly used to create eye diagrams, despite presenting a difficult interconnect issue with the aforementioned DVI and HDMI cables. Oscilloscopes are generic signal measuring devices with manual probes connected to their front panel which are used to get the test signal(s) into the device. Due to the high frequency of digital video signals, it is not advisable to utilize traditional manual probes and modern oscilloscopes do not offer integrated DVI/HDMI connections. In order to seamlessly interface an oscilloscope with DVI/HDMI video cables, a novel method to facilitate the connection and testing of the multiple digital video TMDS pairs is required. The current invention proposes this novel interface.

SUMMARY OF THE INVENTION

The present invention improves upon features of a virtual spectrum analyzer (hereinafter referred to as a "VSA", of the type disclosed in U.S. Pat. No. 6,502,045) and a specific component of it, the errors bounds tool or error bounds toolkit. The error bounds toolkit is a method to create an error demarcation region over and under a test waveform to determine if any portion of the test waveform exists inside of the demarcation region, and is thus out of tolerance (or invalidated).

A novel set of extensions to this concept relates to an eye diagram. Benefits of the new eye diagram feature include the ability to provide a more comprehensive test compared to standard eye diagram software tests, elimination of overlooked anomalies, such as glitches, elimination of numerous voltage and timing measurements as long as a known-good standard is available and a simple one-click eye mask creation. In addition, by introducing a signal multiplexer within the eye diagram hardware, DVI/HDMI TMDS signal pairs may be automatically selected and routed for more efficient eye diagram processing.

BRIEF DESCRIPTION OF DRAWINGS

A more complete appreciation of the present invention and many of the attendant advantages thereof will be readily understood by reference to the following detailed description of the invention when considered in connection with the accompanying drawings in which.

DETAILED DESCRIPTION OF THE INVENTION

Initially, an arrangement in accordance with the invention may include whatever structure is necessary for an automated test equipment to be configured to test electronic signals generated by equipment under test (also referred to as a unit under test UUT) including, but not limited to, simultaneous complex signals. Automated test equipment, or automated test systems, arrangements or devices, is known to those skilled in the art to which this invention pertains, and the invention is equally applicable to and may be incorporated into any number of different automated test equipment. Thus, although structure to enable functionality and operability of the invention is described herein, alternative or additional structure may be used, which structure is disclosed in any number of U.S. patents that disclose automated test equipment, including those mentioned herein. Techniques disclosed herein should not therefore be considered to be limited to any particular automated test equipment.

Figure 1:
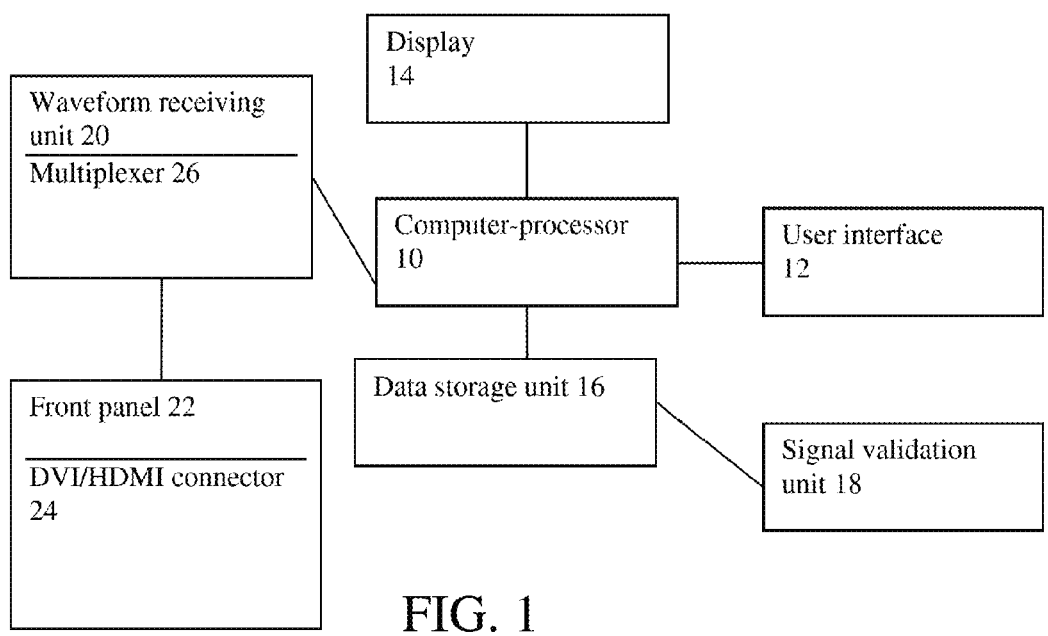
FIG. 1 is a schematic showing structure that may be used to implement the methods in accordance with the invention, i.e., a waveform validation system, and that may be part of or the entirety of an arrangement in accordance with the invention.

Referring first to FIG. 1, an exemplifying, non-limiting structure allowing for eye diagram presentation and characterization testing of binary (digital waveforms) is shown. This structure includes a computer 10 having a processor and access to software embodied on non-transitory computer-readable media (referred generally to as a processing unit), a user interface 12 coupled to the computer 10 and a display 14 coupled to the computer 10. The user interface 12 may be any type of user interface that allows for interaction between a person and the computer 10, including, for example, a mouse, touch screen capability of the display 14, voice recognition program involving a microphone on the computer 10, etc. Display 14 represents an image presentation device that is capable of presenting the eye diagrams shown in FIGS. 3-8, as well as any other visual content described as being displayed herein. The invention causes a particular visual effect on the display 14, in accordance with the processing of the signals.

Thus, the invention may be considered to generally a system, arrangement, apparatus, device and method that each transform an input signal into a structured output signal adapted to an eye diagram visually displayed on a display of a computer, tablet, notepad, smartphone, PDA, etc., with indicia relating to the validity of the signal and optionally a notification of the validity (acceptance) or invalidity of the signal on the same display. By presenting the signal in this manner, a user can view the display 14 and readily determine from the specific transformed signal and simultaneously displayed indicia, whether the signal is valid or invalid.

A data storage unit 16 is also coupled to the computer 10 and a signal validation unit 18 is coupled to the data storage unit 16. Data storage unit 16 may have the capability of providing permanent data storage and/or non-permanent data storage A waveform receiving unit 20 is coupled to the computer 10 and facilitates reception of a digital waveform for processing by the computer 10 in the manner described below. The connections between the components shown in FIG. 1 is not limiting and other, different connections between may be provided, On one hand, each component may be directly connected to each other component or each component may be connected only to those components for which it receives input from or provides output to. One or more buses may be provided and each may connect to a subset of or all of the components, with signal and power being transferred over the bus. Additional components may be connected to the bus to enable functionality or operability to the system, such components being known or readily determinable by one of ordinary skill in the art to which this invention pertains.

When it is desired to enable testing of DVI and/or HDMI signals, a front panel 22 of an apparatus in accordance with the invention is provided with a DVI and/or an HDMI connector 24 on the front panel 22 which is directly connected to an internal multiplexer (switch) 26 that is housed in the same housing as the waveform receiving unit 20 or may be considered a part thereof. In this manner, all DVI/HDMI TMDS signal pairs received via the DVI and/or HDMI connector 24 are connected directly to a multiplexer (switch) 26. The DVI and/or HDMI connector 24 may be a single connector or multiple connectors.

In a more general sense, the front panel 22 includes at least one signal receiving connector, or signal receiving means, that function to receive a signal, e.g., a complex signal, sought to be processed to determine its validity. The signal receiving means may be situated to align with an aperture in the front panel 22, and thus be situated rearward of the front panel in an interior of the waveform receiving unit 20.

The purpose of the multiplexer 26 is to receive multiple signals simultaneously but allow only one to pass therethrough, and thereby cause selection of a signal pair to be digitized by the acquisition module of the instrument and then analyzed with the aforementioned electronic templates. The user interface that controls the multiplexer 26 may be the same user interface 12 and through manual control of the user interface 12 interacting with the computer 10 and possibly also the display 14, the user is able to control the multiplexer 26 and thereby perform the signal selection. As a basic example, a list of signals being received via the DVI and/or HDMI connector 24 may be listed on the display 14, and the user directed to highlight on the display 14 or otherwise designate one of the signals listed on the display 14 to be analyzed using the user interface 12, causing the multiplexer 26 to select the highlighted or designated signal for analysis by the electronic templates.

In operation to test DVI and/or HDMI signals or waveforms, a DVI and/or HDMI cable (not shown) is engaged with the DVI and/or HDMI connector 24 and using the user interface 12, specific digital waveforms being received by the waveform receiving unit 20 via the DVI/HDMI cable connected to the DVI and/or HDMI connector 24 are selected for analysis.

While the concept of a multiplexer 26 used to switch signals from multiple signal sources is known to those in the arts, the combination of placing a, preferably high speed, multiplexer 26 in close proximity to an HDMI/DVI input connector 24 to facilitate automated eye diagram measurements on every TMDS signal pair, thus creating a complete integrated and programmable cable test function, is not believed to have been considered before. While the description of this function specifically applies to digital video signals, this functionality is not limited to digital video signals and may be broadly applied to other multipath non-video signals as well.

The components illustrated in FIG. 1 can be connected to one another, via output and input ports and connectors and other electronic device connection structure known to those skilled in the art, or integrated into a common processing unit to provide the system shown therein. If connections are provided, e.g., from the computer 10 to the display 14, the connections are generally cables, wires and the like. The separation of different components into the blocks does not imply that the separate components are physically separated from one another and two or more of the components, although shown in different blocks, may be integrated into a common piece of electronic hardware or a common piece of software. Moreover, the connections between the different components do not limit the connections and alternative connections are possible in the invention, e.g., connecting the signal validation unit 18 to the computer 10 instead of to the data storage unit 16.

The software available to the computer 10 includes what will be referred to as virtual spectrum analyzer (VSA) software. VSA software disclosed in U.S. Pat. Nos. 8,655,617 and 8,788,228 may be included along with additional VSA software relating to eye diagram presentation and characterization testing of binary (digital) waveforms. The disclosures of these patents is incorporated by reference herein. Utilizing the facilities of the VSA's error bounds tool (also known as a 'golden template'), a more thorough method is now possible. Previously, instrumentation that provided eye diagram functionality implemented features with limited capability due to the complexity of the testing involved and then supplemented that with numerous proprietary voltage and timing measurements.

The data 'masks' that are used in testing are various polygons which allow inconsistent tolerances on certain portions of the tested waveforms, and no testing at all on other areas. Functionally, since a single common mask is applied to every waveform in the digital stream under test, there are instances when waveform anomalies could occur and would not be detected.

In development, it was recognized that in most cases, there are eight permutations of binary waveforms that combine to create an eye diagram presentation. Typically, there are three digital states and two transition points in an eye diagram. Three digital states equates to eight waveform permutations (2^3=8). It was also recognized that each permutation should have its own unique boundary mask in order to completely verify the characteristics of each waveform. Currently, a common mask which is derived only from portions of the eight possible binary waveform permutations is used as a reference for each waveform under test. The common mask is overlaid against each waveform and coincidence is gauged. Since the binary waveforms diverge, crossover, and re-converge (at the digital junction points) over the span of the eye diagram, it is possible that anomalies, such as 'glitches', existing at the junction points would be ignored since the common eye mask does not identify individual waveforms and applies the mask in total. Ideally, with eight waveforms, there should be eight waveform masks.

Current instrumentation adds several additional timing and voltage measurement tools in order to complete the verification of the quality of the binary signals. However, this simply adds to the complexity of the overall test and does not address the problem of applying the common eye mask.

It should be noted for the discussion herein, that conventional eye diagram instruments apply a single mask combining all of the possible excursions for the digital signal, rather than treating each possible binary permutation as a separate entity.

Figure 2:
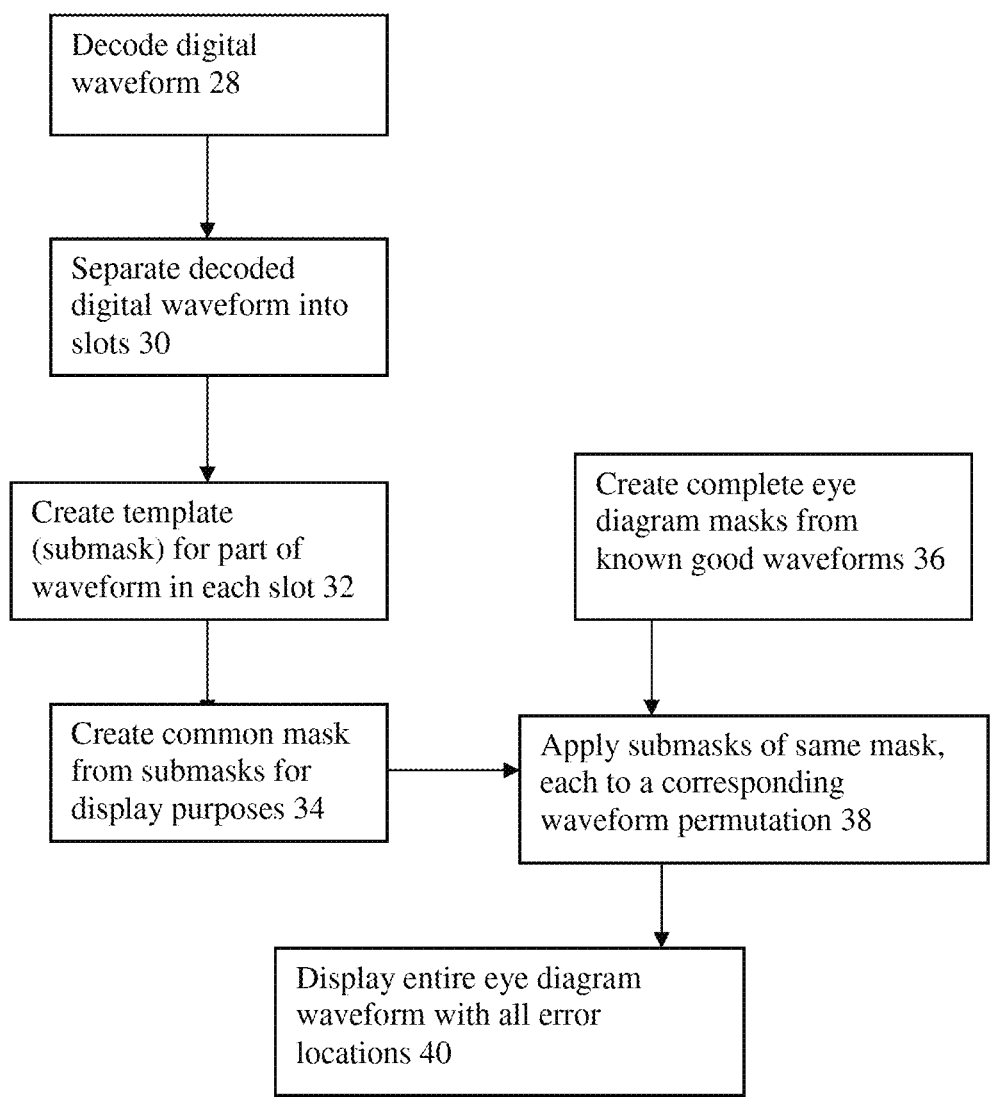
FIG. 2 is a flow chart of an exemplifying method in accordance with the invention, and which method may be practiced by an arrangement in accordance with the invention.
Figure 3:
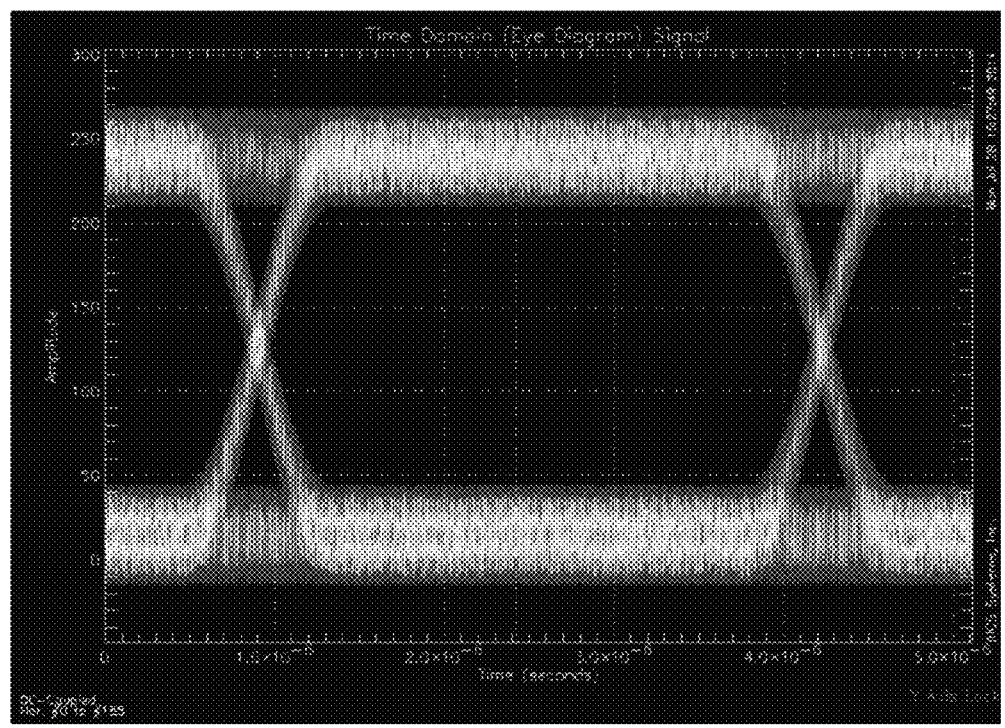
FIG. 3 shows a typical color-coded eye diagram that may be presented on a display of an arrangement in accordance with the invention.

Addressing these issues, the virtual spectrum analyzer in accordance with the invention (the arrangement shown in FIG. 1) is configured to perform and operatively performs the following functions:

Decode an incoming digital waveform and separate the decoded incoming waveform into one-of-eight 'slots' (steps 28 and 30 in FIG. 2). These two steps can be performed separately or together in one stage, e.g., via a waveform decoding unit in the computer 10 (or in other parts of the arrangement shown in FIG. 1). FIG. 3 shows a typical color-coded eye diagram derived from a digital waveform. Color-coding shows the most frequent path of the waveform.

More specifically, the hardware will create and transmit specific binary pulse sequences into the cable under test. At the opposite end of the cable, the hardware will repeatedly trigger acquisition circuitry and digitize (acquire) the signal. Thus, the digital signal is captured as if it were an analog signal. The digitized data will be uploaded from the instrument (hardware) to the external analysis software (VSA). If the captured digital waveform is not identified, software will examine each captured waveform individually to identify which of the eight waveforms it is. If the waveform is already identified, for instance, by having programmed the hardware with a known binary sequence, this step does not need to be performed.

To decode the waveform, software will look at specific points on the waveform (e.g., the voltage values at the 5%, 50% and 95% location values) and assign a binary code (0 or 1) depending on whether the amplitude is above or below the 50% amplitude threshold. Thus, three binary bits will be assigned signifying one-of-eight possible codes (2^3)

Separation of the incoming digital waveform into the eight slots means that a part of the digital waveform will be associated with each of the slots.

The next step 32 in FIG. 2 is to create a template (error bounds) for each of the eight slots. In the VSA 'eye diagram mode', slot assignments for only eight electronic templates will be made (the number of waveform permutations). Acquired waveforms may be combined into a single data file containing many individual captures of the eight types of waveforms. Contrary to standard VSA techniques, still only eight templates will be assigned. Each of those waveforms will be decoded as one of the eight possible waveforms.

Figure 4:
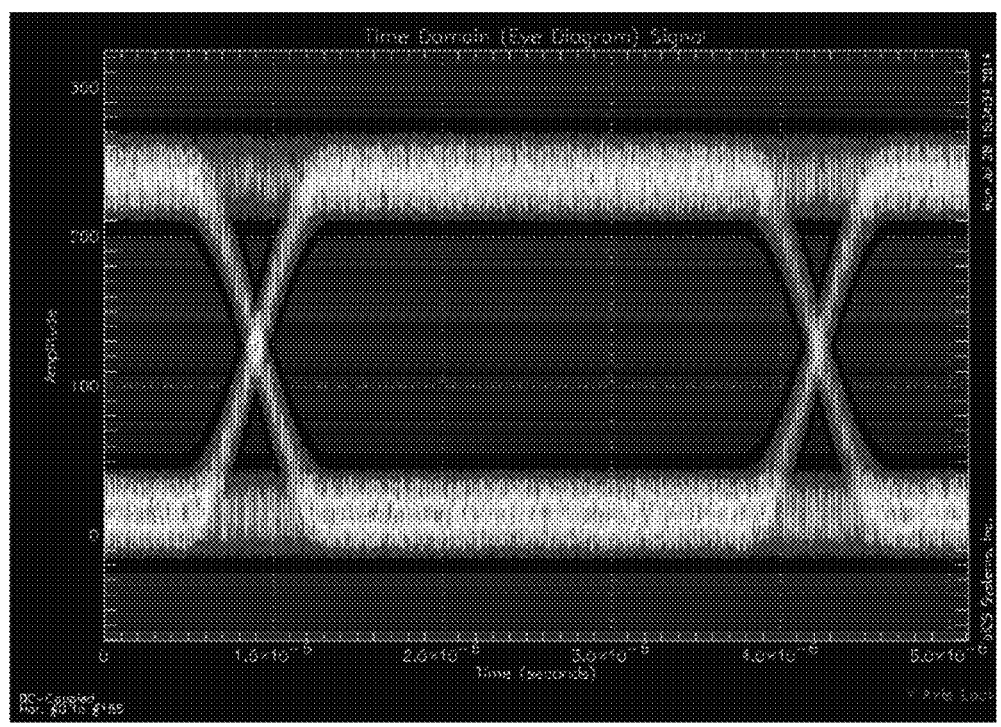
FIG. 4 shows the color-coded eye diagram of FIG. 3 with a composite mask applied and which may also be presented on a display of an arrangement in accordance with the invention.

In step 34 in FIG. 2, for VSA display presentations, a visible composite mask is created from all eight sub-masks, but the individual masks are used when waveform testing. For eye diagram presentation purposes, all eight masks will be overlaid to form one composite mask. The captured digital data will be aggregated into a color-coded image and displayed with the composite mask. FIG. 4 shows the eye diagram of FIG. 3 with a composite mask applied showing the allowable signal region. If the signal enters the blue region, it is a considered an error, i.e., the signal is not validated.

That is, all waveform data points which intrude into the mask will be denoted with a marker and counted in the metrics. The metrics are used to determine pass or fail status. Only the mask that is associated with any single waveform is used to test that waveform. This ensures that the signal excursions allowed by the other masks do not falsely allow excursions for the waveform under test.

Figure 5:
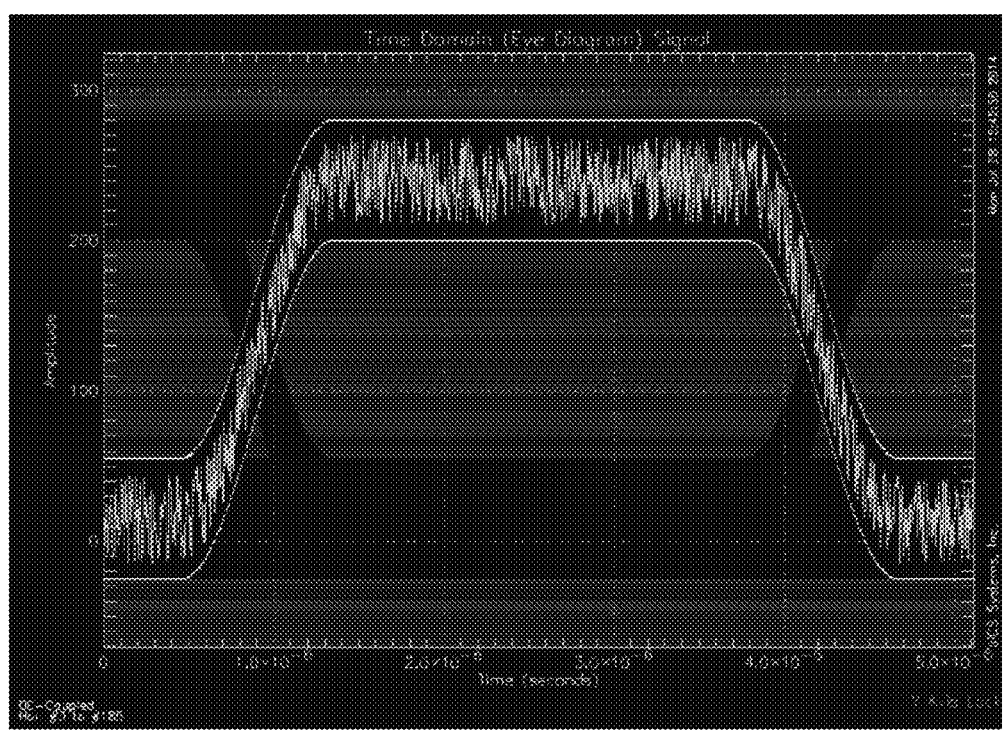
FIG. 5 shows the color-coded eye diagram of FIG. 3 with a submask shown, outlined in dots and which may also be presented on a display of an arrangement in accordance with the invention.

FIG. 5 shows the eye diagram of FIG. 3 with a single submask shown, outlined in white dots, and being specific to one of the waveform permutations, i.e., the waveform shown in one iteration of one of the eight waveform permutations in the dataset. To correctly test this waveform, the waveform was decoded to identify which of the eight permutations it was and then the correct submask was applied to it (from among eight possible submasks corresponding to the eight permutations). The process is repeated for any other waveform permutations in the digital waveform. By contrast, in current commercial instruments, the entire region of the composite mask (shown in FIG. 3) is applied to each waveform iteration. As a result, when the submask technique in accordance with the invention is applied on a submask by submask basis to the digital waveform, a more precise test is applied.

Conventional eye diagram instruments do not make a distinction between the waveforms and can erroneously allow anomalies in certain situation.

Figure 6:
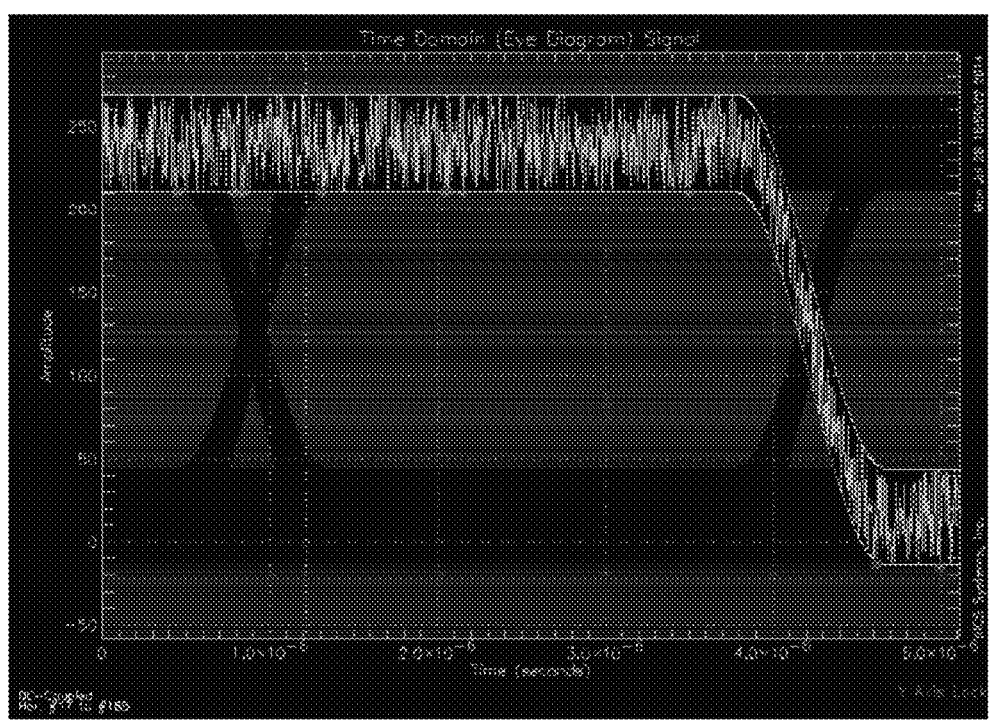
FIG. 6 shows the color-coded eye diagram of FIG. 3 with a submask shown and indicating that the signal exceeded the allowed boundary in several locations and which may also be presented on a display of an arrangement in accordance with the invention.
Figure 7:
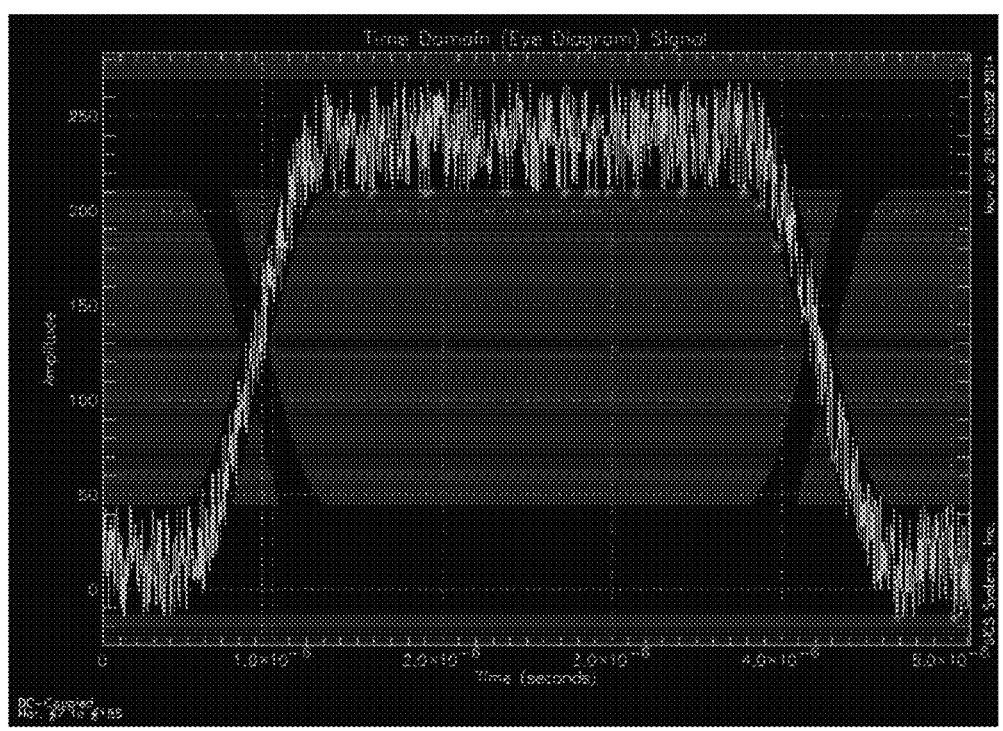
FIG. 7 shows the color-coded eye diagram of FIG. 3 with a submask shown and indicating with asterisks that the signal exceeded the allowed boundary in several locations and which may also be presented on a display of an arrangement in accordance with the invention.

FIG. 6 shows that the waveform, when the appropriate submask is applied, exceeds the allowable boundary in several locations, evident when the outlined submask is maintained. FIG. 7 on the hand, shows the removal of the outlined submask and places an asterisk at each location where the signal deviates from the allowable boundary (the error bounds).

Figure 8:
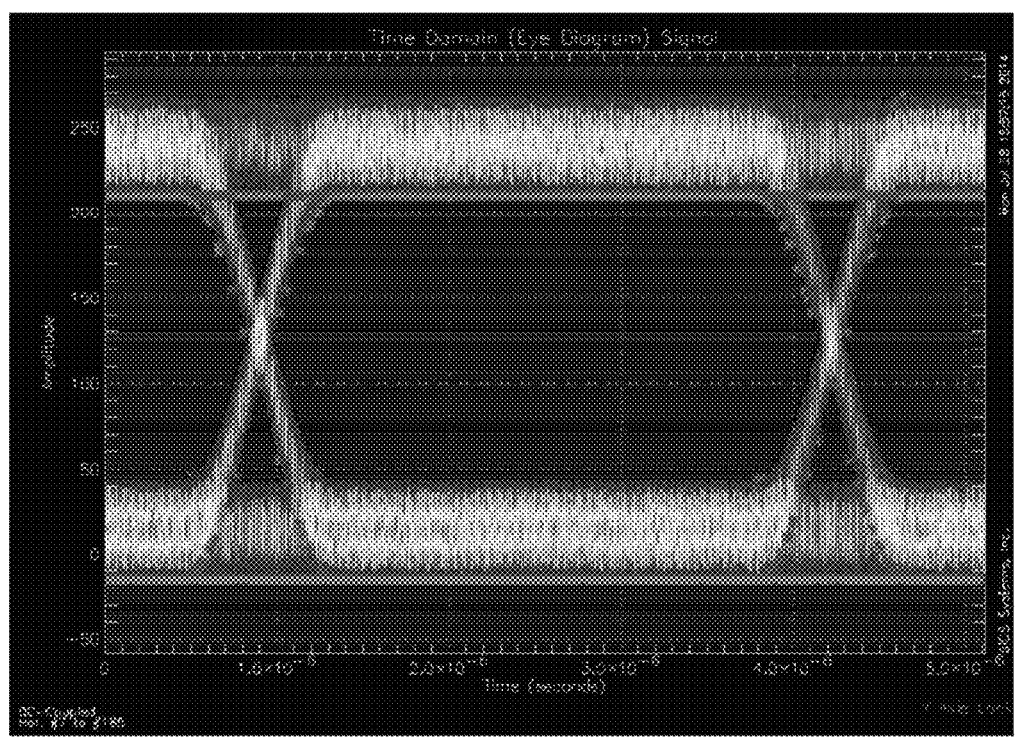
FIG. 8 shows the color-coded eye diagram of FIG. 3 showing the locations where the signal exceeded the allowed boundary but without the submask shown and which may also be presented on a display of an arrangement in accordance with the invention.

Once the appropriate submask is applied to each of the eight waveform permutations, and errors are identified, a composite eye diagram may be displayed on display 14 simultaneously with all of the errors depicted, see FIG. 8. Also, FIG. 8 shows that the entire waveform set is shifted slightly lower in voltage than is allowed by the mask.

In step 36 in FIG. 2, a complete eye diagram mask is created automatically from known-good binary waveforms. The masks will encompass every data point on the waveforms. An eye diagram mask is created by capturing known-good binary waveforms, decoding them and creating a template into one of the eight appropriate slots using previously defined VSA techniques. Each template will be modified by successive captures until it is decided that the template fully characterizes the waveform. Step 36 may be performed at any time, i.e., not necessarily after the creation of the composite mask from the digital waveform whose validity is to be assessed.

This preparation of the eye diagram mask is then operatively used in the same manner as the known good waveforms in the applicant's earlier VSA patents. That is, the waveform to be tested is analyzed and one of the masks from the memory component is retrieved, which mask corresponds to a known, good form of this waveform. Criteria for determining which mask to retrieve from the memory component may be developed in view of the disclosure herein. For example, the mask may be selected based on analysis by a processor of at least one characteristic of the digital waveform to be tested and at least one characteristic of the known, good waveform from which the mask, and its submasks, were derived. This mask contains a number of submasks equal to the number of waveform permutations. The submasks of the retrieved mask are applied to the waveform permutations, one submask for each corresponding waveform permutations, step 38.

In one embodiment, a dynamic learning feature is provided that will automatically modify/adapt all sub-masks to comply with newly captured waveforms. In instances where templates must be created from several different systems (in order to create a common characterization), established templates may be modified either manually or automatically with captured waveforms from the different systems.

Custom masks may be saved to memory, e.g., to an external file for later use. Such uses include for archive purposes and in a database repository or other type of memory component, such as data storage unit 16.

Mask incursions may then be counted and errors reported with a Pass/Fail indicator based on a programmable tolerance. This allows creation of an automated eye diagram tester which is not reliant on traditional measurements (such as eye height, eye width, jitter, etc.). The waveform characterization, as captured in the template, encompasses the behavior of the known-good waveform and ensures that the waveform under test closely mimics it.

Testing is preferably executed continuously or 'Stop on Failure' when the tolerance criteria is exceeded.

Each point that violates the eye diagram mask may be visually indicated, e.g., on display 14, or on another visual presentation device, e.g., transmitted to a smartphone, PDA, notepad, tablet computer, and the like. Individual failing points within any of the eight waveforms types may be displayed to better characterize the nature of the failure. Thus, in step 40 in FIG. 2, the entire eye diagram waveform may be displayed at the same time as all error locations to enable visual assessment of the acceptability or validity of the waveform.

The criteria to render a waveform acceptable (valid) or unacceptable (invalid) may depend on a variety of factors, some of which are known or readily ascertainable to those skilled in the waveform processing field, e.g., in view of the disclosure herein. For example, a criterion may be defined to allow a preset deviation for each Y-axis value of the original waveform from which the submask is derived. Another criterion may allow only deviations within a defined threshold dependent on the values of the waveform. Other criteria may also be used in the invention to define the parameters of an acceptable waveform or an unacceptable waveform.

Live data can then be processed directly from an instrument or from a dataset stored in an external file.

Furthermore, this principle is expandable. For example, if the binary waveform had 4 states, the number of rules would be increased to 16 and so forth. There is no software limitation of the number of states that may be tested other than the physical storage of the computer. Processing time is not affected by an increase of binary states.

The invention differs from the applicant's earlier VSA processing techniques in that the decoding and separation of an incoming digital waveform into one of a plurality of slots, eight in the disclosed embodiment, is unique to eye diagrams. Such decoding and separation into discrete slots is not required unless an eye diagram is sought to be created.

Moreover, the creation of a mask or error bounds for each of the eight slots is also unique to processing of an eye diagram. Eight is the number of waveform permutations in the disclosed technique. Every video line or waveform would have its own template.

Creation of a composite mask from all eight submasks for display presentation, yet use of the individual masks when testing waveforms is also specific to eye diagram representation. That is, the overall mask is not applied at one time to the digital waveform represented as an eye diagram. Rather, the digital waveform is separated into overlapping waveform parts or permutations according to rules, e.g., based on digital states and transition points, and the separated waveform parts are independently compared to corresponding submasks of an overall mask. The display however, is preferably a display of all points or locations determined to be outside of the allowable boundaries for any of the waveform permutations relative to the corresponding submask of the common mask.

Creation of a complete eye diagram mask automatically from known good binary waveforms enables a large number of captured waveforms from all waveform permutations to be parsed, decoded and electronic templates automatically built for the eight permutations. This differs from other virtual spectrum analysis techniques wherein a separate template is constructed for every waveform, repetitive or not.

It is possible to construct a computer program or implement the method in accordance with the invention. This can be effected through use of a user interface 12, or multiple user interfaces if present.

In the embodiment described above, and illustrated in the drawings, there are three states and two transitions leading to eight permutations that combine to create the eye diagram. Use of the invention with three states and two transitions is only a preferred embodiment of the invention and it is considered within the scope of the invention that a different number of states is possible, e.g., four or more, and a different number of transitions, e.g., three or more. The number of permutations generally depends on the number of digital states and transitions or transition points in the eye diagram, and the claimed invention is equally applicable to and encompasses techniques for displaying digital waveforms having any number of states each with its corresponding number of permutations, e.g., three states and two transition points with eight permutations as an example only.

The invention also includes a method for generating the submasks for application to a digital waveform in an eye diagram. The output of this method is a plurality of submasks stored in computer readable form that can be retrieved for use to assess the validity of a waveform signal. The submasks may be stored in a data storage unit, and the data storage unit including the generated submasks may be sold as a unit, or may available for networked access. Digital information and/or computer-derived information about waveforms, and their validity, has thus been transformed by this method into submasks stored in retrievable form. These submasks are usable to operatively assess validity of a signal when desired, using a processor of the computer seeking to assess the validity of the signal, and enabling display of the processing results on a display which constitute the waveform transformed through use of the submasks.

This method includes obtaining a plurality of known good digital waveforms in an eye diagram, displaying each of the known good digital waveforms on a display preferably to enable a number of digital states and transition points in the eye diagram to be determined (whether manually or automatically by a software algorithm programmed to performed this determination), and performing a submask derivation procedure for each known good waveform using a processor implementing a software algorithm designed to perform submask derivation.

The manner in which a programmer can design an algorithm to perform the determination of the number of digital states and transition points in the eye diagram is known or readily ascertainable to those skilled in the art of programming software involving manipulation of eye diagrams, especially in consideration of the disclosure herein. Generally, this algorithm and an algorithm that performs the submask derivation, would be designed and reduced to a form executable by a processor configured to perform the method in accordance with the invention, or otherwise reside in a system, apparatus, device, arrangement in accordance with the invention.

In one embodiment, the submask derivation procedure includes separating, using a processor, each of the known good waveforms into a plurality of overlapping waveform permutations based on the determined number of digital states and transition points in the eye diagram, generating a number of submasks equal in number to the waveform permutations from the known good waveform, each submask being indicative of allowed deviation of values of the respective waveform permutation, and finally storing the submasks in a memory component in association with the respective known good waveform from which the submasks are derived. The memory component (data storage unit 16) therefore includes a list of submasks and also a list of associate good known waveforms. Each known good waveform may be decoded using a processor. The memory component is made available to an arrangement that is seeking to analyze a waveform of unknown validity. Thus, the memory component may be considered to be a database, and is made accessible in the same manner as memory components and databases are made available.

A basic method for displaying a digital waveform in an eye diagram with an indication of acceptability of the digital waveform in accordance with the invention therefore transforms a transitory waveform into a dynamic or static eye diagram being displayed on a physical display and at the same time, determines an indication of the acceptability or validity of the waveform and provides this indication simultaneously to a person viewing the display, e.g., as a visual, audible indication or both. As an initial step in the method, a decoded digital waveform is separated, using a processor (of computer 10), into a plurality of overlapping waveform permutations based on a number of digital states and transition points in the eye diagram, and from a memory component including a submask database, a number of submasks equal in number to the waveform permutations is retrieved. The submasks are derived from a common, known good waveform, e.g., as described in the submask generating method described immediately above.

Using a processor (e.g., of computer 10), each of the retrieved submasks is applied to a corresponding one of the waveform permutations to determine any locations at which the waveform permutation exceeds a boundary of the submask. Only one of the submasks is applied to each of the waveform permutations. Finally, the waveform in the eye diagram is displayed on the display with a visual indication of the locations at which any of the waveform permutations exceeds the boundary of the corresponding submask.

Other steps in the method include receiving, using a waveform receiving unit 20, a digital waveform which is then decoded using the processor (of computer 10). The waveform receiving unit 20 may comprise a signal multiplexer 26, in which case, a DVI and/or HDMI connector is connected to the signal multiplexer 26, and using a user interface 12, specific digital waveforms being received by the waveform receiving unit 20 via a DVI/HDMI cable connected to the DVI and/or HDMI connector are selected.

To improve submask storage, a single mask may be created from all of the submasks derived from the common, known good waveform, and stored in the memory component. The retrieved mask can then be divided, if desired, into separate submasks or used as an overall/omnibus mask for the waveform.

As an additional aspect of the method, in a preparatory stage, a plurality of masks are created, each mask comprising a number of submasks equal in number to the number of waveform permutations and each corresponding to one of the submasks, and the plurality of created mask are stored in the memory component (data storage unit 16). Then, in the operative stage, a determination is made by a processor (of computer 10) of which of the plurality of stored masks to use based on the decoded waveform leading to retrieval of that mask from the memory component, the submasks of this retrieved mask being applied to the corresponding waveform permutations. A mask formed by all of the submasks may be displayed on the display 14.

When there are at least three digital states and at least two transition points in the eye diagram, the processor separates the decoded digital waveform into at least eight waveform permutations. When there are only three digital states and only two transition points in the eye diagram, the processor separates the decoded digital waveform into only eight waveform permutations.

In one embodiment, the submasks derived from the common, known good waveform are selected by the processor (of computer 10) based on analysis of at least one characteristic of the digital waveform and at least one characteristic of the known, good waveform. This characteristic-based selection of the submasks renders the invention highly adaptive to specific waveforms and leads to accurate waveform acceptability determinations.

The processor (of computer 10) recited herein may be, as known to those skilled in the art, a multi-component unit that may include one or more processing units. Thus, the invention is not limited to a single processor or single processing unit that performs whatever functions are recited as being performed by a processor, but rather, multiple processing units may be provided, which in combination are considered to be a processor as claimed. Thus, while one function may be performed by a processor of computer 10, another function may be performed by an additional processor, whether of computer 10 or another component in the system shown in FIG. 1.

In the context of this document, computer-readable medium or media could be any means that can contain, store, communicate, propagate or transmit a program for use by or in connection with the method or arrangement disclosed above. The computer-readable medium can be, but is not limited to (not an exhaustive list), electronic, magnetic, optical, electromagnetic, infrared, or semi-conductor propagation medium. The medium can also be (not an exhaustive list) an electrical connection having one or more wires, a portable computer diskette, a random access memory (RAM), a read-only memory (ROM), an erasable, programmable, read-only memory (EPROM or Flash memory), an optical fiber, and a portable compact disk read-only memory (CD-ROM). The medium can also be paper or other suitable medium upon which a program is printed, as the program can be electronically captured, via for example, optical scanning of the paper or other medium, then compiled, interpreted, or otherwise processed in a suitable manner, if necessary, and then stored in a computer memory. Also, a computer program or data may be transferred to another computer-readable medium by any suitable process such as by scanning the computer-readable medium.

Having thus described a few particular embodiments of the invention, various alterations, modifications, and improvements will readily occur to those skilled in the art. Such alterations, modifications and improvements as are inherent or made obvious by this disclosure are intended to be part of this description though not expressly stated herein, and are intended to be within the spirit and scope of the invention. Accordingly, the foregoing description is by way of example only, and is not limiting. The invention is limited only as defined in the claims and equivalents thereto.

The invention claimed is:

1. A method for transforming a digital waveform into a display of the digital waveform in an eye diagram with an indication of acceptability of the digital waveform, comprising:

separating, using a processor, a decoded digital waveform into a plurality of overlapping waveform permutations based on a number of digital states and transition points in the eye diagram;

retrieving, from a memory component coupled to the processor, a number of submasks equal in number to the waveform permutations, the submasks being derived from a common, known good waveform;

providing the retrieved submasks to the processor;

applying, using the processor, each of the retrieved submasks to a corresponding one of the waveform permutations to determine any locations at which the waveform permutation exceeds a boundary of the submask, only one of the submasks being applied to each of the waveform permutations; and displaying on a display coupled to the processor, the waveform in the eye diagram simultaneously with a visual indication of the locations at which any of the waveform permutations exceeds the boundary of the corresponding submask, whereby the display of the waveform in the eye diagram along with the simultaneous visual indication of the locations at which any of the waveform permutations exceeds the boundary of the corresponding submask enables a viewer of the display to assess acceptability of the digital waveform.

2. The method of claim 1, further comprising receiving, using a waveform receiving unit coupled to the processor, a digital waveform, the received digital waveform being decoded using the processor to provide the decoded digital waveform.

3. The method of claim 2, wherein the waveform receiving unit comprises a signal multiplexer, further comprising:

connecting a DVI and/or HDMI connector to the signal multiplexer; and selecting, using a user interface coupled to the waveform receiving unit, specific digital waveforms being received by the waveform receiving unit via a DVI/HDMI cable connected to the DVI and/or HDMI connector.

4. The method of claim 1, further comprising:

creating a single mask from all of the submasks derived from the common, known good waveform; and storing the single mask in the memory component, wherein the step of retrieving a number of submasks equal in number to the waveform permutations comprises retrieving the single mask from the memory component and then dividing the single mask into its constituent submasks.

5. The method of claim 1, further comprising:

in a preparatory stage, creating a plurality of masks, each mask comprising a number of submasks equal in number to the number of waveform permutations and each corresponding to one of the submasks; and storing the plurality of created masks in the memory component; and in an operative stage, determining which of the plurality of masks stored in the memory component to use based on the decoded digital waveform and retrieving that mask from the memory component, the submasks of this retrieved mask being applied to the corresponding waveform permutations.

6. The method of claim 1, further comprising displaying a mask formed by all of the submasks on the display.

7. The method of claim 1, wherein there are at least three digital states and at least two transition points in the eye diagram such that the processor separates the decoded digital waveform into at least eight waveform permutations or there are only three digital states and only two transition points in the eye diagram such that the processor separates the decoded digital waveform into only eight waveform permutations.

8. The method of claim 1, further comprising selecting the submasks derived from the common, known good waveform based on analysis, using the processor, of at least one characteristic of the digital waveform and at least one characteristic of the common, known good waveform.

9. The method of claim 1, further comprising selecting the submasks derived from the common, known good waveform based on analysis, using the processor, of at least one characteristic of the digital waveform.

10. The method of claim 1, further comprising selecting the submasks derived from the common, known good waveform based on analysis, using the processor, of at least one characteristic of the common, known good waveform.

11. An arrangement for transforming a digital waveform into a display of the digital waveform in an eye diagram with an indication of acceptability of the digital waveform, comprising:

a processor that separates a decoded digital waveform into a plurality of overlapping waveform permutations based on a number of digital states and transition points in the eye diagram;

a memory component coupled to said processor and containing a plurality of masks, each mask comprising a number of submasks equal in number to the waveform permutations, the submasks of each mask being derived from a common, known good waveform, said processor being configured to retrieve one of the masks from said memory component and apply each of the submasks of the retrieved mask to a corresponding one of the waveform permutations to determine any locations at which the waveform permutation exceeds a boundary of the submask, only one of the submasks being applied to each of the waveform permutations; and a display coupled to said processor and on which the waveform in the eye diagram is displayed simultaneously with a visual indication of the locations at which any of the waveform permutations exceeds the boundary of the corresponding submask as determined by said processor.

12. The arrangement of claim 11, further comprising a waveform receiving unit coupled to said processor and that receives a digital waveform, the received digital waveform being decoded using said processor to provide the decoded digital waveform.

13. The arrangement of claim 12, wherein said waveform receiving unit comprises a signal multiplexer, further comprising a DVI and/or HDMI connector connected to said signal multiplexer, said waveform receiving unit being configured to receive digital waveforms via a DVI/HDMI cable connected to said DVI and/or HDMI connector.

14. The arrangement of claim 11, wherein said processor is further configured to determine which of the plurality of masks in said memory components to use based on the decoded digital waveform.

15. The arrangement of claim 11, wherein said display is configured to display a mask formed by all of the submasks.

16. The arrangement of claim 11, wherein there are at least three digital states and at least two transition points in the eye diagram such that said processor separates the decoded digital waveform into at least eight waveform permutations or there are only three digital states and only two transition points in the eye diagram such that said processor separates the decoded digital waveform into eight waveform permutations.

17. The arrangement of claim 11, wherein said processor is further configured to select the mask to retrieve from said memory component based on analysis of at least one characteristic of the digital waveform and at least one characteristic of the common, known good waveform.

18. A method for generating submasks for application to a digital waveform in an eye diagram for use in transforming the digital waveform into a display of the digital waveform in the eye diagram with an indication of acceptability of the digital waveform, comprising:

obtaining a plurality of known good digital waveforms in an eye diagram;

displaying each of the known good waveforms on a display;

when each known good waveform is displayed, determining a number of digital states and transition points in the eye diagram; and for each known good waveform, separating, using a processor, the known good waveform into a plurality of overlapping waveform permutations based on the determined number of digital states and transition points in the eye diagram;

generating a number of submasks equal in number to the waveform permutations from the known good waveform, each submask being indicative of allowed deviation of values of the respective one of the waveform permutations; and storing the submasks in a memory component in association with the respective known good waveform from which the submasks are derived.

19. The method of claim 18, further comprising decoding, using a processor, each of the known good waveforms before being separated into the plurality of overlapping waveform permutations.

20. The method of claim 19, wherein there are at least three digital states and at least two transition points in the eye diagram such that the step of separating, using the processor, the known good waveform into a plurality of overlapping waveform permutations comprises separating the known good waveform after decoding into at least eight overlapping waveform permutations or there are only three digital states and only two transition points in the eye diagram such that the step of separating, using the processor, the known good waveform into a plurality of overlapping waveform permutations comprises separating the known good waveform after decoding into only eight overlapping waveform permutations.

* * * * *